United States Patent
Vergel et al.

(10) Patent No.: US 10,644,927 B2
(45) Date of Patent: May 5, 2020

(54) TEST INSTRUMENTS AND METHODS FOR COMPENSATING IQ IMBALANCE

(71) Applicant: Viavi Solutions, Inc., San Jose, CA (US)

(72) Inventors: Julio Vergel, Wichita, KS (US); Daniel Moore, Wichita, KS (US); Raja Balu, Wichita, KS (US)

(73) Assignee: VIAVI SOLUTIONS, INC., San Jose, CA (US)

( * ) Notice: Subject to any disclaimer, the term of this patent is extended or adjusted under 35 U.S.C. 154(b) by 0 days.

(21) Appl. No.: 16/457,957

(22) Filed: Jun. 29, 2019

(65) Prior Publication Data
US 2020/0007378 A1 Jan. 2, 2020

Related U.S. Application Data

(60) Provisional application No. 62/691,675, filed on Jun. 29, 2018.

(51) Int. Cl.
*H04L 27/36* (2006.01)
*H04B 10/61* (2013.01)
(Continued)

(52) U.S. Cl.
CPC ........ *H04L 27/364* (2013.01); *G01R 31/3171* (2013.01); *G01R 31/31701* (2013.01);
(Continued)

(58) Field of Classification Search
CPC ... H04L 27/364; H04B 10/6165; H04B 10/40; G01R 31/31701; G01R 31/3171; G06F 17/142; G06F 17/16
See application file for complete search history.

(56) References Cited

U.S. PATENT DOCUMENTS

2011/0069744 A1* 3/2011 Laudel ................. H04B 1/0032
375/219
2016/0285667 A1* 9/2016 Deng .................. H04L 27/2666

OTHER PUBLICATIONS

De Witt, Josias Jacobus, "Modelling, Estimation and Compensation of Imbalances in Quadrature Transceivers," Mar. 2011, 239 pages.
(Continued)

*Primary Examiner* — Ted M Wang
(74) *Attorney, Agent, or Firm* — DLA Piper LLP (US)

(57) ABSTRACT

A test instrument may include a transmitter configured to transmit signals to a unit under test, a receiver configured to receive signals from the unit under test, and a controller configured to generate a transmitter compensation filter by (i) transmitting, with the transmitter, complex multi-sine signals over a first plurality of observed frequencies within a predetermined baseband frequency range, (ii) estimating a first plurality of frequency responses that compensate for in-phase and quadrature (IQ) imbalance at the first plurality of observed frequencies within the predetermined baseband frequency range, and (iii) determining, using the first plurality of frequency responses, a transmitter polynomial surface, and to compensate, using the transmitter compensation filter, at least one of the signals to be transmitted by the transmitter to reduce IQ imbalance in the transmitted signals, including using the transmitter polynomial surface to calculate a frequency response that reduces the IQ imbalance in the transmitted signals.

20 Claims, 10 Drawing Sheets

(51) Int. Cl.
*H04B 10/40* (2013.01)
*G06F 17/16* (2006.01)
*G01R 31/317* (2006.01)
*G06F 17/14* (2006.01)

(52) U.S. Cl.
CPC ............ *G06F 17/142* (2013.01); *G06F 17/16* (2013.01); *H04B 10/40* (2013.01); *H04B 10/6165* (2013.01)

(56) References Cited

OTHER PUBLICATIONS

Key Sight Technologies, M9381A PXIe Vector Signal Generator Data Sheet, Dec. 1, 2017, 29 pages.
Key Sight Technologies, M9381A PXIe Vector Signal Generator Specifications Guide, May 2015, 25 pages.
The Mathworks, Inc., "Polynomial curve fitting—MATLAB polyfit," downloaded from http://www.mathworks.com/help/matlab/ref/polyfit.html (Sep. 16, 2019), 11 pages.
Litepoint, "z8751 Vector Signal Generator PXI, PXIe," 2015, 22 pages.
Rohde & Schqarz GmbH & Co., "R&S SMBV100A Vector Signla Generator," Aug. 2008, 20 pages.
Nealen, Andrew, "As-Short-as-Possible Introduction to the Least Squares, Weighted Least Squares and Moving Least Squares Methods for Scattered Data Approximation and Interpolation," 1992, 3 pages.

* cited by examiner

| Parameter | Value |
|---|---|
| Filter Length (L) | 61 |
| Number Signal (K) | 3 |
| Tx Amplitude Imbalance ($\Delta\eta$) | 2 |
| Observations (N) | 125 |
| Bandwidth ($B_W$) | 250 MHz |
| $f\ step = \frac{B_W}{N}$ | 2 MHz |
| RF interval | 50 MHz |
| Local RF Number | 3(4) |
| Degree RF | 5 |
| Degree BB | 42 |
| Window | Blackman |
| Cross Terms | Yes |

Table 1
ALGORITHM VALUES

FIG. 6

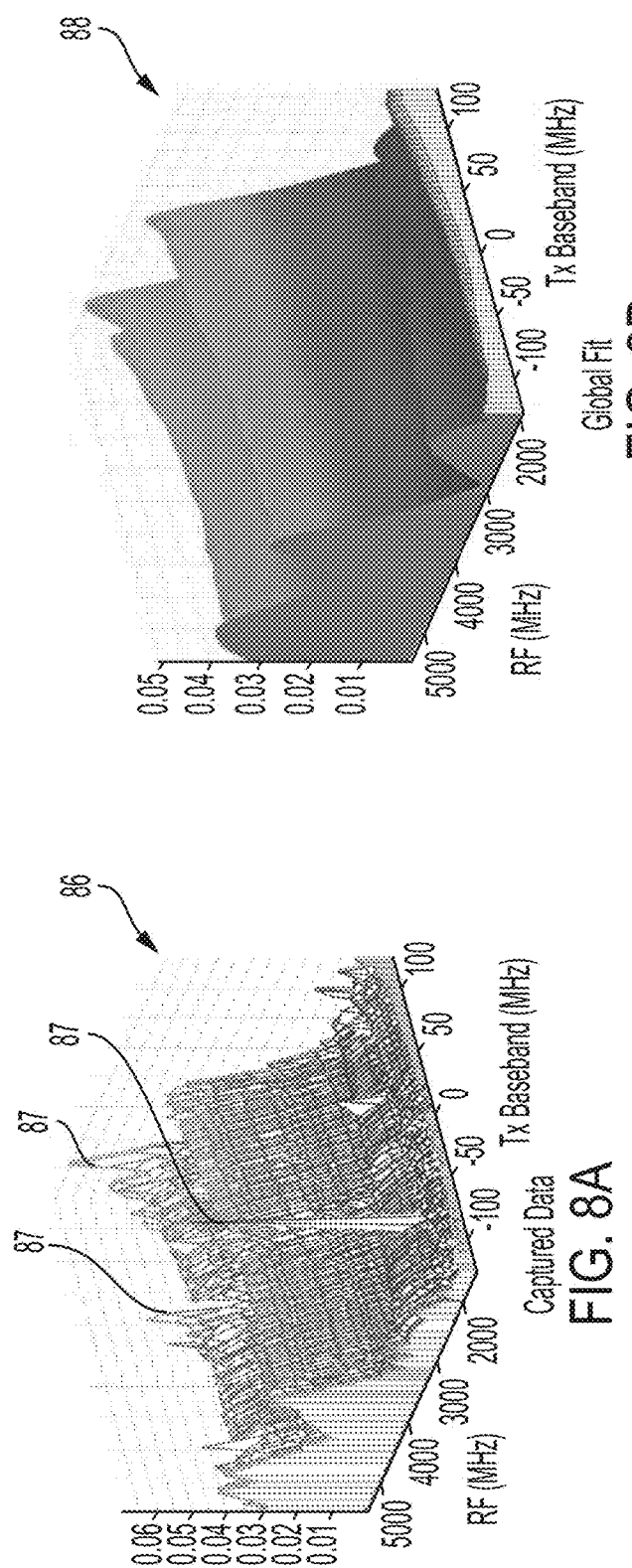
FIG. 8A Captured Data
FIG. 8B Global Fit
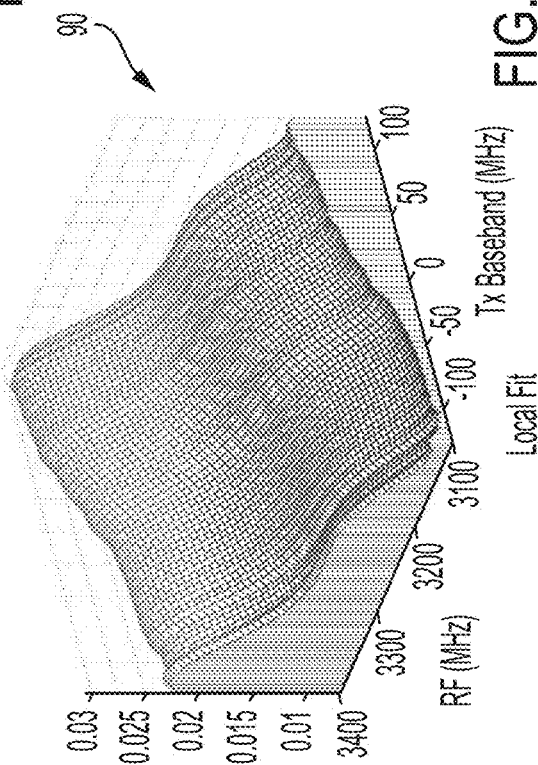
FIG. 8C Local Fit

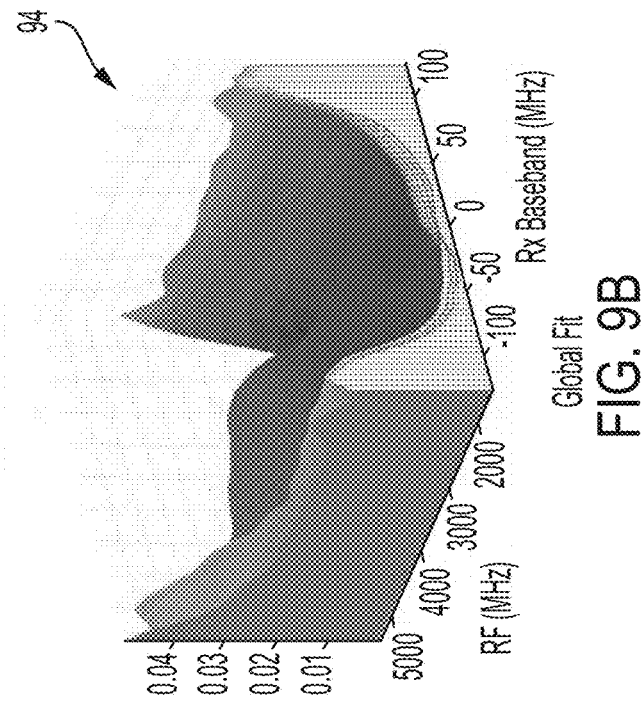
FIG. 9A Captured Data
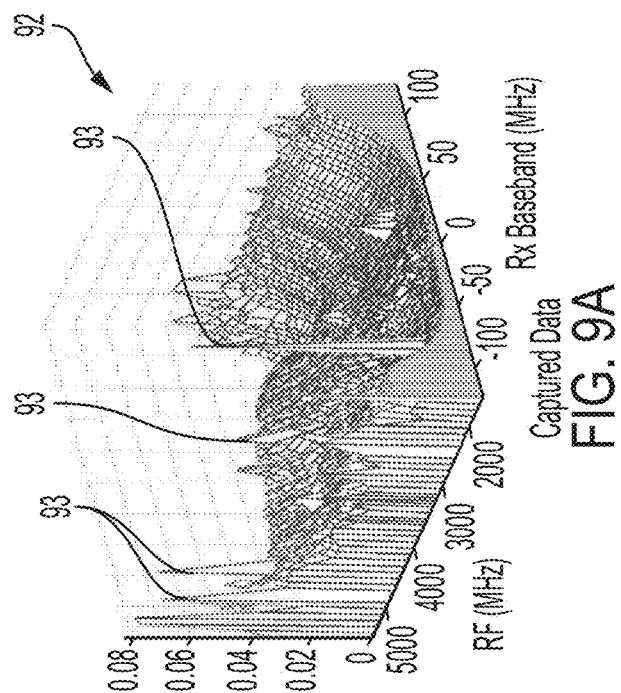
FIG. 9B Global Fit
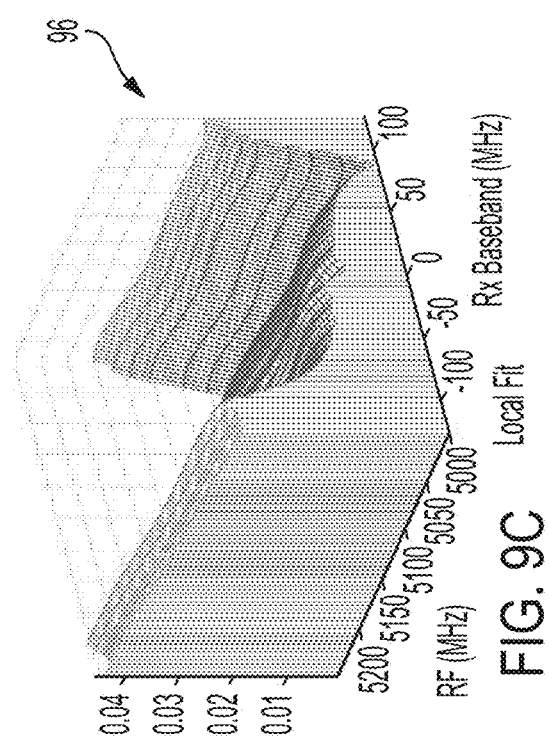
FIG. 9C Local Fit

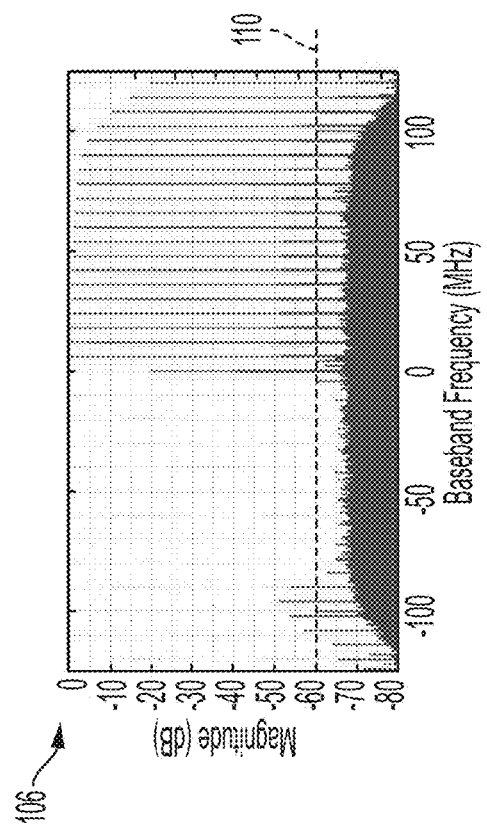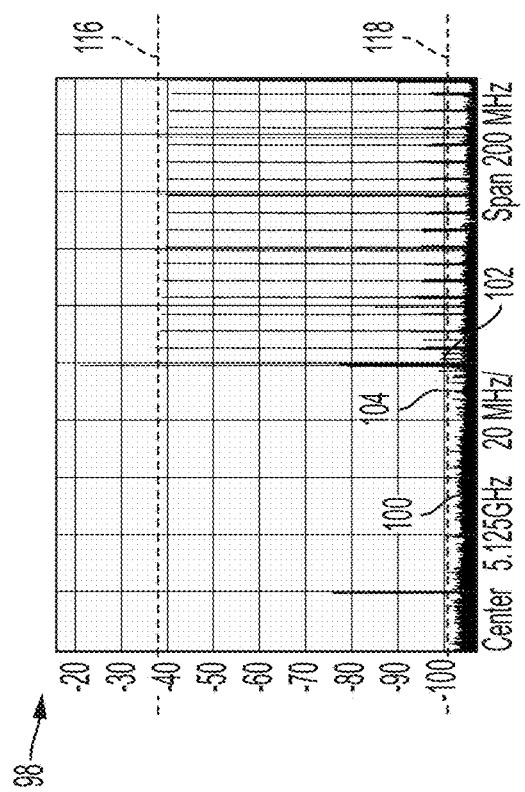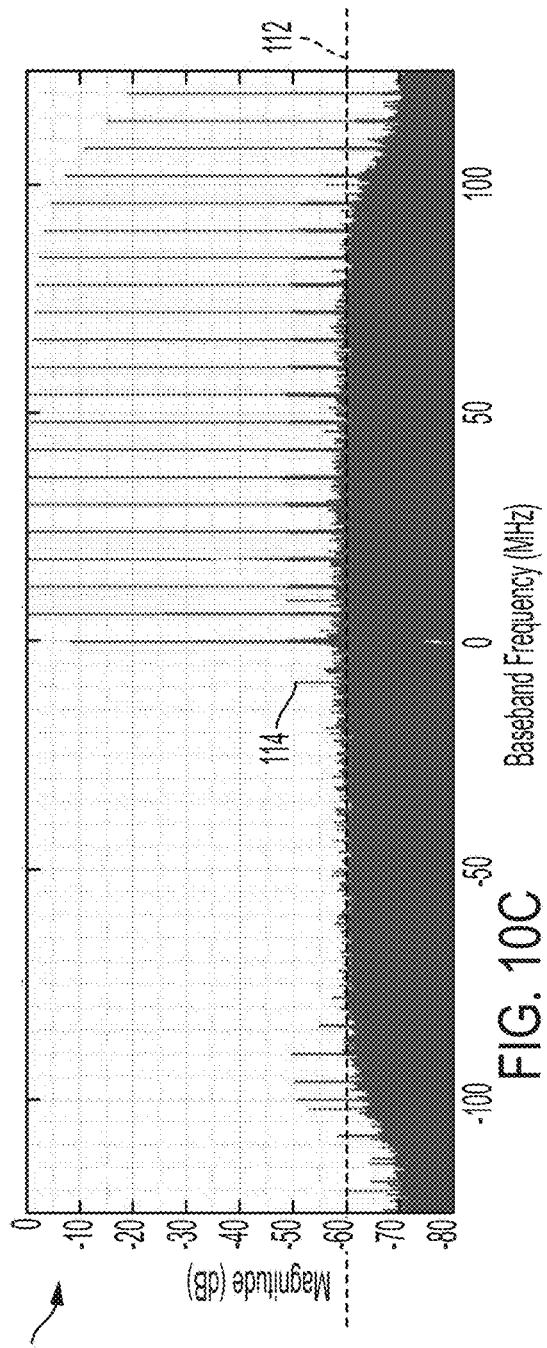

TEST INSTRUMENTS AND METHODS FOR COMPENSATING IQ IMBALANCE

CROSS-REFERENCE TO RELATED APPLICATIONS

This application claim priority to and the benefit of U.S. Provisional Patent Application No. 62/691,675, filed Jun. 29, 2018, the entire disclosure of which is incorporated by reference herein.

TECHNICAL FIELD

The present disclosure relates to test instruments and equipment, and more specifically, to systems, methods, and devices using direct-conversion receivers and transmitters.

BACKGROUND

IQ imbalance is one of the major impairments introduced by analog components (mixer and filters) in direct-conversion (or zero-intermediate frequency (IF)) receivers and transmitters. This impairment produces degradation in the performance of both communication systems and test equipment. IQ imbalance is mainly introduced by mixer imperfections and frequency differences between in-phase (I) and quadrature (Q) channels. This impairment produces degradation in the performance of both communication systems and test equipment.

SUMMARY

According to one aspect of the present disclosure, a test instrument may comprise a transmitter configured to transmit signals to a unit under test, a receiver configured to receive signals from the unit under test, and a controller. The controller may be configured to generate a transmitter compensation filter at least by (i) transmitting, with the transmitter, complex multi-sine signals over a first plurality of observed frequencies within a predetermined baseband frequency range, (ii) estimating a first plurality of frequency responses that compensate for in-phase and quadrature (IQ) imbalance at the first plurality of observed frequencies within the predetermined baseband frequency range, and (iii) determining, using the first plurality of frequency responses, a transmitter polynomial surface. The controller may further be configured to compensate, using the transmitter compensation filter, at least one of the signals to be transmitted by the transmitter to reduce IQ imbalance in the transmitted signals, including using the transmitter polynomial surface to calculate a frequency response that reduces the IQ imbalance in the transmitted signals.

In some embodiments, the controller may further be configured to generate a receiver compensation filter at least by (i) receiving, with the receiver, complex multi-sine signals over a second plurality of observed frequencies within the predetermined baseband frequency range, (ii) estimating a second plurality of frequency responses that compensate for IQ imbalance at the second plurality of observed frequencies within the predetermined baseband frequency range, and (iii) determining, using the second plurality of frequency responses, a receiver polynomial surface. The controller may further be configured to compensate, using the receiver compensation filter, at least one of the signals to be received by the receiver to reduce IQ imbalance in the received signals, including using the receiver polynomial surface to calculate a frequency response that reduces the IQ imbalance in the received signals.

In some embodiments, to generate the transmission compensation filter may further comprise transmitting an amplitude imbalance signal in response to phases of the transmitter and the receiver not being synchronized.

In some embodiments, the controller may be configured to generate the transmitter compensation filter and the receiver compensation filter at the same time by offsetting respective operating frequencies of a mixer of the transmitter and a mixer of the receiver during the transmitting and receiving of the complex multi-sine signals.

In some embodiments, the controller may be configured to offset the respective operating frequencies by a multiple of a bin size of a fast Fourier transform (FFT) block, such that each of complex sines and images of the IQ imbalance lie on a bin of the FFT block.

In some embodiments, the first plurality of observed frequencies may comprise (i) a first observation at a positive predefined frequency when a complex sine signal is transmitted at one of the positive predefined frequency and a complex conjugate of the positive predefined frequency and (ii) a second observation at a negative predefined frequency when a complex sine signal is transmitted at one of the negative predefined frequency and a complex conjugate of the negative predefined frequency.

In some embodiments, the controller may be configured to transmit the complex multi-sine signals by transmitting separate complex sine signals at different times.

In some embodiments, the transmitter polynomial surface may include at least one frequency outside the predetermined baseband frequency range.

In some embodiments, the IQ imbalance may include IQ imbalance images, and the controller may be configured to reduce the IQ imbalance images to be at least 60 decibels (dB) below the signals to be transmitted by the transmitter.

In some embodiments, the controller may be configured to determine the transmitter polynomial surface by approximating a multi-variable polynomial function using a least squares approach.

In some embodiments, the controller may include a transmitter IQ imbalance compensator, a receiver IQ imbalance compensator, a transmitter amplitude correction engine, a receiver amplitude correction engine, a transmitter resampling engine, a receiver resampling engine, an acquisition engine, an arbitration engine, and a trigger routing matrix, where the acquisition and arbitration engines are both in communication with the trigger routing matrix.

According to another aspect of the present disclosure, a method may comprise generating a transmitter compensation filter. Generating the transmitter compensation filter may comprise the steps of (i) transmitting, with a transmitter, complex multi-sine signals over a first plurality of observed frequencies within a predetermined baseband frequency range, (ii) estimating a first plurality of frequency responses that compensate for in-phase and quadrature (IQ) imbalance at the first plurality of observed frequencies within the predetermined baseband frequency range, and (iii) determining, using the first plurality of frequency responses, a transmitter polynomial surface.

In some embodiments, the method may further comprise compensating, using the transmitter compensation filter, a signal transmitted by the transmitter to reduce IQ imbalance in the transmitted signal, including using the transmitter polynomial surface to calculate a frequency response that reduces the IQ imbalance in the transmitted signal.

In some embodiments, the method may further comprise generating a receiver compensation filter. Generating the receiver compensation filter may comprise the steps of (i) receiving, with a receiver, complex multi-sine signals over a second plurality of observed frequencies within the predetermined baseband frequency range, (ii) estimating a second plurality of frequency responses that compensate for IQ imbalance at the second plurality of observed frequencies within the predetermined baseband frequency range, and (iii) determining, using the second plurality of frequency responses, a receiver polynomial surface.

In some embodiments, the method may further comprise compensating, using the receiver compensation filter, a signal received by the receiver to reduce IQ imbalance in the received signal, including using the receiver polynomial surface to calculate a frequency response that reduces the IQ imbalance in the received signal.

In some embodiments, the transmitter compensation filter and the receiver compensation filter may be generated at the same time by offsetting respective operating frequencies of a mixer of the transmitter and a mixer of the receiver during the transmitting and receiving of the complex multi-sine signals.

In some embodiments, the first plurality of observed frequencies may comprise (i) a first observation at a positive predefined frequency when a complex sine signal is transmitted at one of the positive predefined frequency and a complex conjugate of the positive predefined frequency and (ii) a second observation at a negative predefined frequency when a complex sine signal is transmitted at one of the negative predefined frequency and a complex conjugate of the negative predefined frequency.

According to yet another aspect of the present disclosure, a test instrument may comprise a transmitter configured to transmit signals to a unit under test, a receiver configured to receive signals from the unit under test, and a controller configured to reduce in-phase and quadrature (IQ) imbalance of the signals to be transmitted and received. The controller may be configured to reduce IQ imbalance at least by (i) transmitting complex multi-sine signals over a first plurality of observed frequencies within a predetermined baseband frequency range, (ii) receiving the transmitted multi-sine signals over a second plurality of observed frequencies within the predetermined baseband frequency range, the second plurality of observed frequencies being offset from the first plurality of observed frequencies, (iii) estimating corresponding sets of frequency responses for the transmitted and received signals that compensate for IQ imbalance at the first and second pluralities of observed frequencies within the predetermined baseband frequency range, (iv) determining, using the sets of frequency responses, polynomial surfaces, (v) approximating each of the polynomial surfaces with a corresponding one of transmitter and receiver multi-variable polynomials, and (vi) reducing the IQ imbalance of the signals to be transmitted and received based on frequency responses calculated using the transmitter and receiver multi-variable polynomials.

In some embodiments, the controller may be configured to reduce the IQ imbalance such that IQ imbalance images are at least 60 decibels (dB) below at least one of the transmitted and received signals.

In some embodiments, the controller may be configured to reduce the IQ imbalance for frequencies covering a 6-GHz bandwidth.

BRIEF DESCRIPTION OF THE DRAWINGS

The detailed description particularly refers to the following figures, in which:

FIG. 6 is a table illustrating exemplary parameters that may be used to estimate and compensate for the IQ imbalance;

FIG. 8A is a graph illustrating a compensation filter surface of the transmitter of FIG. 1;

FIG. 8B is a graph illustrating a polynomial surface fit for any RF frequency based on the estimated compensation filter of FIG. 8A;

FIG. 8C is a graph illustrating a local polynomial surface fit around the RF frequency to compensate that is generated using parameters of FIG. 6 to estimate and compensate the IQ imbalance;

FIG. 9A is a graph illustrating a compensation filter surface of the receiver of FIG. 1;

FIG. 9B is a graph illustrating a polynomial surface fit for any RF frequency based on the estimated compensation filter of FIG. 9A;

FIG. 9C is a graph illustrating a local polynomial fit around a targeted RF frequency that is generated using parameters of FIG. 6 to estimate and compensate the IQ imbalance;

FIG. 10A is a graph illustrating spectrum of images of the TX imbalance at 5.125 GHz; and FIGS. 10B and 10C are graphs illustrating output after pre-compensation in the transmitter and post-compensation in the receiver of FIG. 1.

DETAILED DESCRIPTION OF THE DRAWINGS

Figure 1:
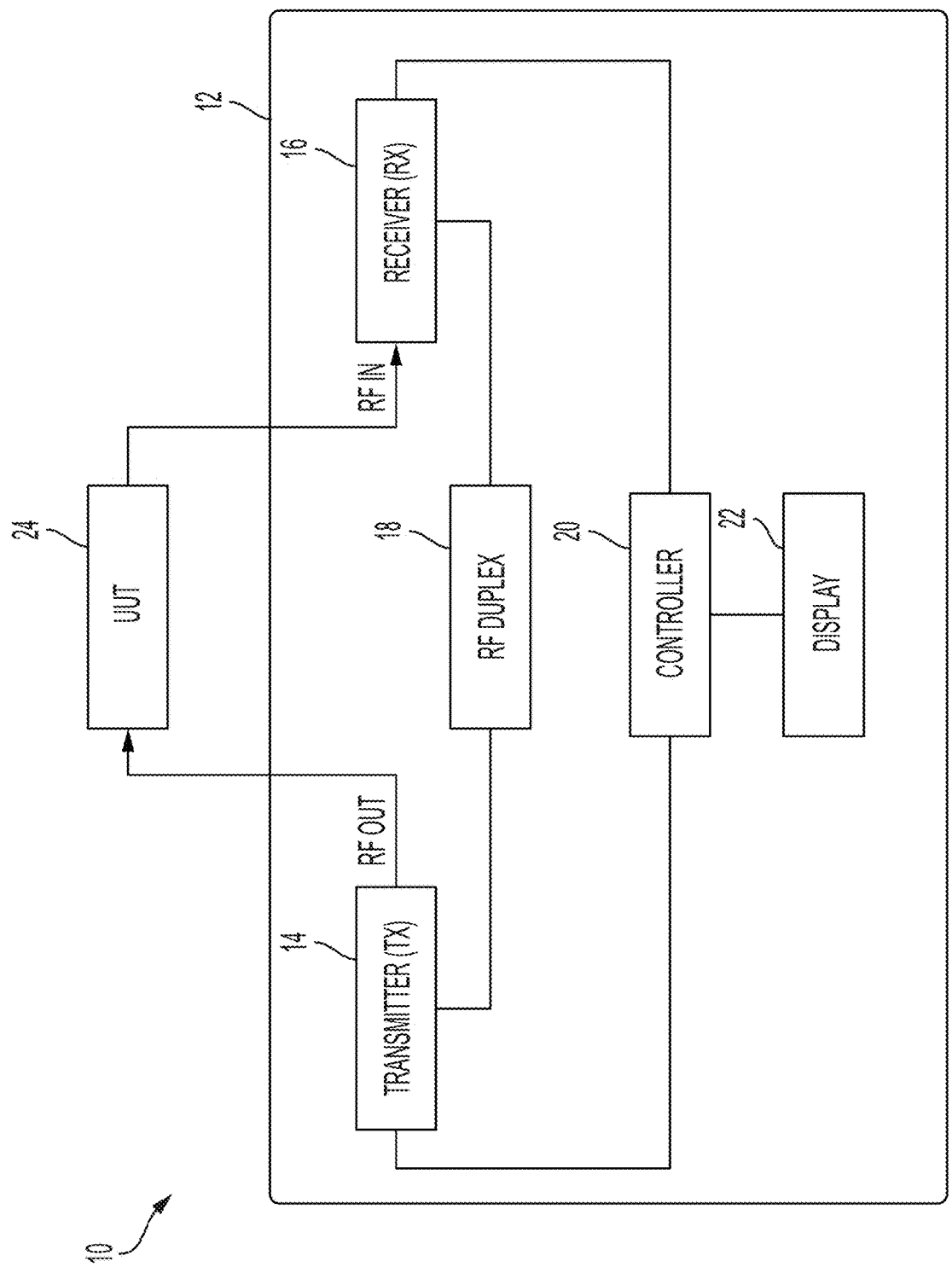
FIG. 1 is a simplified block view of a testing system that includes a test instrument system and a unit under test (UUT)

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the invention as defined by the appended claims.

Referring now to FIG. 1, a test instrument system 10 configured to evaluate a unit under test (UUT) 24 is shown. In the illustrative embodiment, the test instrument 10 includes a direct-conversion test signal generator transmitter 14 configured to transmit test signals to the UUT 24 and a direct-conversion receiver 16 configured to receive signals from the UUT 24. As discussed above, IQ imbalance may be introduced by mixer imperfections and frequency differences between in-phase (I) and quadrature (Q) channels. This impairment produces degradation in the performance of communication systems and in the accuracy of the test instrument 12. As such, the test instrument 12 is configured to compensate the IQ imbalance impairments at the transmitter 14 and the receiver 16 to improve the operation of the test instrument 12.

As discussed in detail below, the test instrument 12 is configured to estimate compensation filters to remove IQ imbalances for the transmitter 14 and the receiver 16 at a given RF frequency based on observations using a compensation algorithm. Specifically, a compensation filter on the transmitter 14 is used to pre-compensate a transmitted signal to the UUT 24 to reduce the IQ imbalance introduced by a transmit (also referred to as TX) analog chain, whereas, a compensation filter on the receiver 16 is used to post-compensate a received signal from the UUT 24 to reduce the IQ imbalance introduced by a receive (also referred to as RX) analog chain. It should be appreciated that the estimated compensation filters at the observed RF frequencies may be stored for calibration. In other words, the test instrument 12 is configured to determine a compensation filter for a set of RF frequencies that may be used to verify whether IQ imbalance images are lower than a predefined threshold level. For example, IQ imbalance images that are lower than 60 dB below the transmitted/received signal is desired. In the illustrative embodiment, the test instrument 12 is configured to compensate for any RF frequency up to 6 GHz by converting the observation frequencies to a surface that can be approximated, using a least squares approach, to a multi-variable polynomial function, as described in greater detail below. It should be appreciated that the IQ imbalance compensation process may be implemented on any suitable platform.

As shown in FIG. 1, the test instrument 12 includes the transmitter or generator 14, the receiver 16, a radiofrequency (RF) duplex 18, a controller 20, and a display 22. The transmitter 14 may be embodied as any type of circuitry and/or components capable of communicating with the UUT 24 to transmit signals to the UUT 24. The receiver 16 may be embodied as any type of circuitry and/or components capable of communicating signals from the UUT 24 to receive signals from the UUT 24. In the illustrative embodiment, the transmitter 14 and the receiver 16 communicate through separate ports or connectors with the UUT 24. However, in some embodiments, the transmitter 14 and the receiver 16 may communicate with the UUT 24 via the radiofrequency (RF) duplex port or connector 18. The RF duplex connector 18 may be embodied as any type of circuitry and/or components capable of performing bi-directional communication between the transmitter 14/the receiver 16 and the UUT 24 by sharing a common connector.

The controller 20 may be embodied as any type of device or collection of devices capable of performing various compute functions described herein. In the illustrative embodiment, the controller 20 is configured to estimate compensation filters at a given RF frequency for the transmitter 14 and the receiver 16 based on observations. Additionally, the controller 20 may load the estimated compensation filters to verify that IQ imbalance images are lower than a predefined threshold.

The display 22 of the test instrument 12 may be embodied as any type of display capable of displaying digital information such as a liquid crystal display (LCD), a light emitting diode (LED), a plasma display, a cathode ray tube (CRT), or other type of display device. In some embodiments, the display 22 may be coupled to a touch screen to allow user interaction with the test instrument 12. The test instrument 12 may also include any number of additional input/output devices, interface devices, and/or other peripheral devices. For example, in some embodiments, the peripheral devices may include a touch screen, graphics circuitry, keyboard, mouse, speaker system, network interface, and/or other input/output devices, interface devices, and/or peripheral devices.

Figure 2:
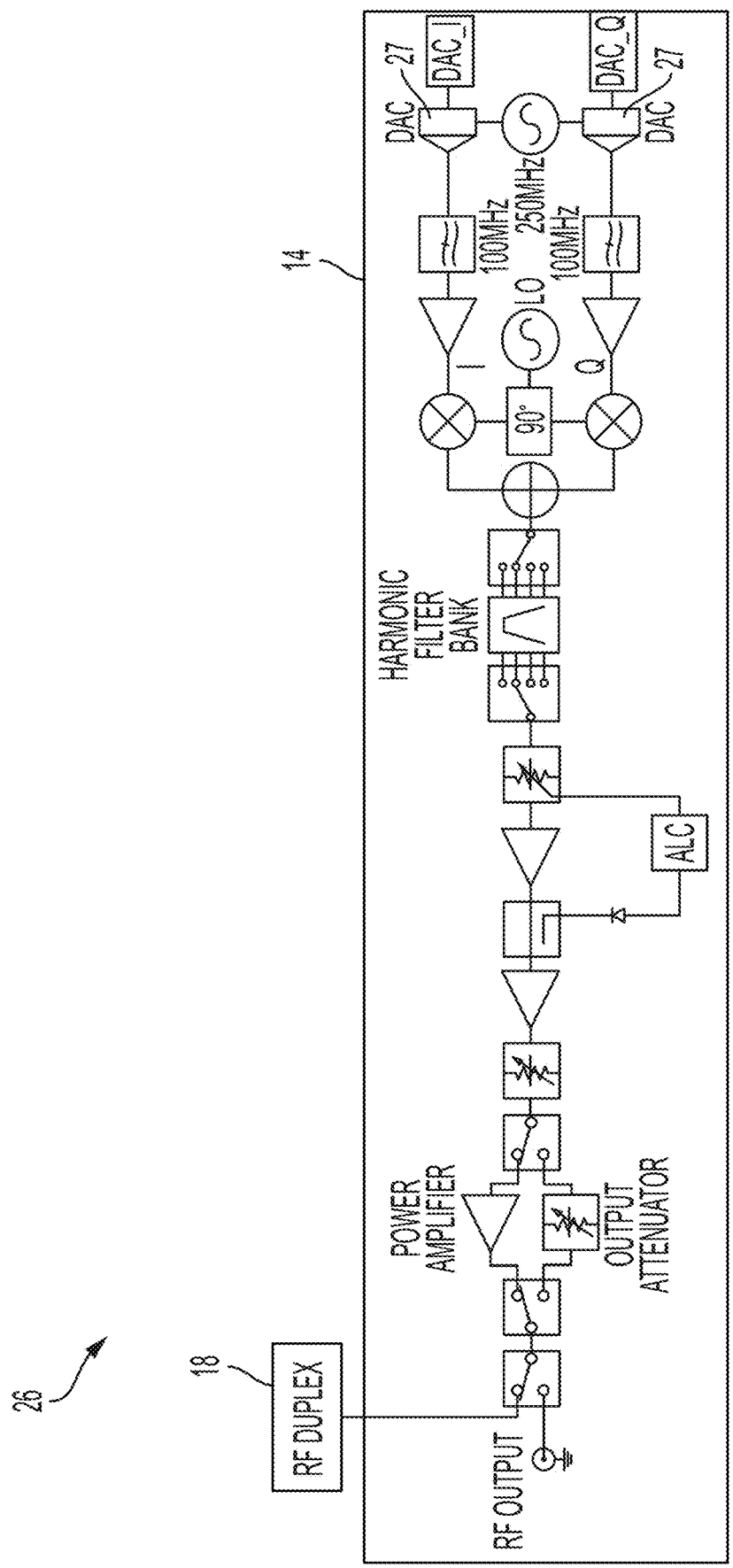
FIG. 2 is a schematic block diagram of transmitter circuitry of the test instrument of FIG. 1.
Figure 3:
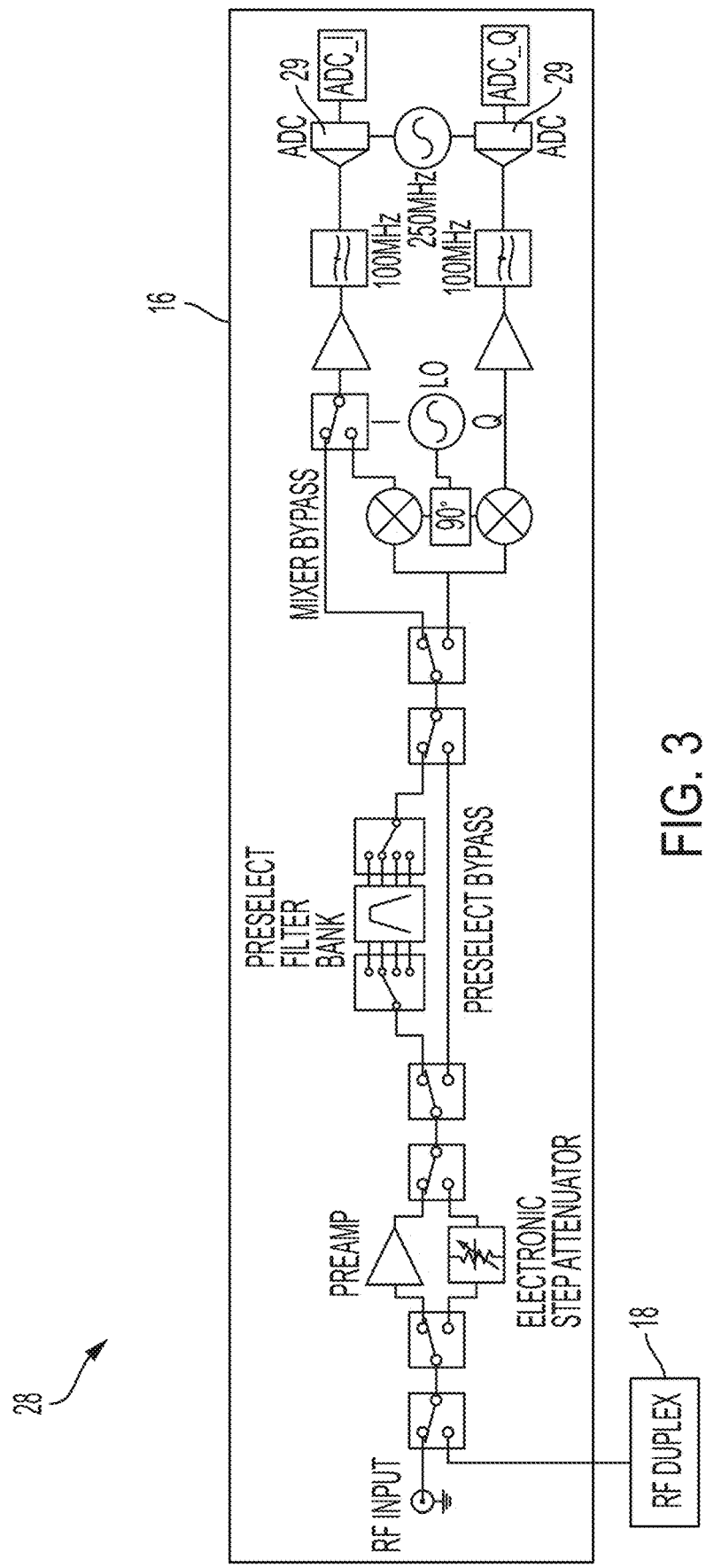
FIG. 3 is a schematic block diagram of receiver circuitry of the test instrument of FIG. 1.

Referring now to FIG. 2, an exemplary circuitry 26 illustrating architecture of the transmitter 14 communicatively coupled to the RF duplex 18 is shown. The transmitter 14 includes one or more digital-to-analog (DA) converters 27 that are configured to convert incoming RF signal samples in digital form into an analog RF signal. The analog RF signal may be modulated prior to being transmitted to the UUT 24. Referring now to FIG. 3, an exemplary circuitry 28 illustrating architecture of the receiver 16 communicatively coupled to the RF duplex 18 is shown. The receiver 16 includes one or more analog-to-digital (AD) converters 29 that are configured to convert analog RF output signal into a digitized RF signal. The digitized RF signal may be demodulated prior to being outputted to the controller 20. It should be appreciated that, in some embodiments, the transmitter 14 and the receiver 16 may be combined into a transceiver that both transmits and receives signals.

Figure 4:
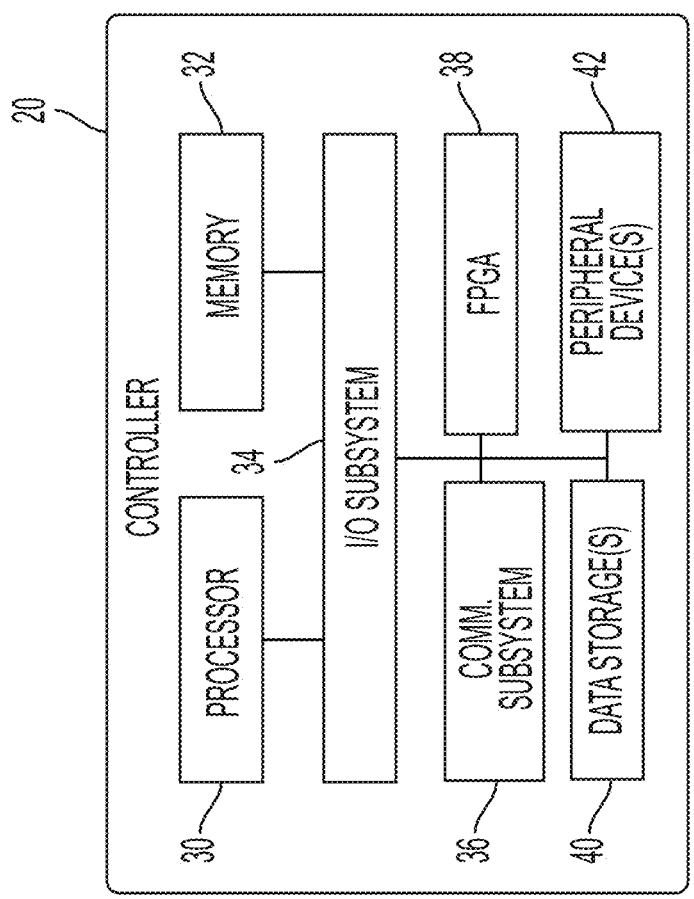
FIG. 4 is a simplified block view of a controller of the test instrument of FIG. 1.

The controller 20 may be embodied as any type of computation or computer device capable of performing the functions described herein, including, without limitation, a computer, a server, a workstation, a laptop computer, a notebook computer, a tablet computer, a mobile computing device, a wearable computing device, a network appliance, a distributed computing system, a processor-based system, and/or a consumer electronic device. As shown in FIG. 4, the controller 20 illustratively includes a processor 30, a memory 32, an input/output (I/O) subsystem 34, a communication subsystem 36, a field-programmable gate array (FPGA) 38, one or more data storages 40, and one or more peripheral devices 42. It should be appreciated that the controller 20 may include other or additional components, such as those commonly found in a computer (e.g., various input/output devices), in other embodiments. Additionally, in some embodiments, one or more of the illustrative components may be incorporated in, or otherwise form a portion of, another component. For example, the memory 32, or portions thereof, may be incorporated in the processor 30 in some embodiments.

The processor 30 may be embodied as any type of processor capable of performing the functions described herein. For example, the processor 30 may be embodied as a single or multi-core processor(s), digital signal processor, microcontroller, or other processor or processing/controlling circuit. Similarly, the memory 32 may be embodied as any type of volatile or non-volatile memory or data storage capable of performing the functions described herein. In operation, the memory 32 may store various data and software used during operation of the test instrument 12 such as operating systems, applications, programs, libraries, and drivers. The memory 32 is communicatively coupled to the processor 30 via the I/O subsystem 34, which may be embodied as circuitry and/or components to facilitate input/output operations with the processor 30, the memory 32, and other components of the controller 20. For example, the I/O subsystem 34 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. In some embodiments, the I/O subsystem 34 may form a portion of a system-on-a-chip (SoC) and be incorporated, along with the processor 30, the memory 32, and other components of the controller 20 (e.g., peripheral devices 42), on a single integrated circuit chip.

The communication subsystem 36 may be embodied as any type of communication circuit, device, or collection thereof, capable of enabling communications between the controller 20 and the UUT 24. To do so, the communication subsystem 36 may be configured to use any one or more communication technologies (e.g., wireless or wired communications) and associated protocols (e.g., Ethernet, Bluetooth®, Wi-Fi®, WiMAX, LTE, 5G, etc.) to effect such communication. The FPGA 38 may be embodied as any type of circuit that includes an array of programmable logic blocks that is configurable to estimate and compensate IQ imbalance. The data storage 40 may be embodied as any type of device or devices configured for short-term or long-term storage of data such as, for example, memory devices and circuits, memory cards, hard disk drives, solid-state drives, or other data storage devices. In the illustrative embodiment, the data storage 40 may store estimated complex filters for the transmitter 14 and the receiver 16 at observed RF frequencies for calibration.

Figure 5:
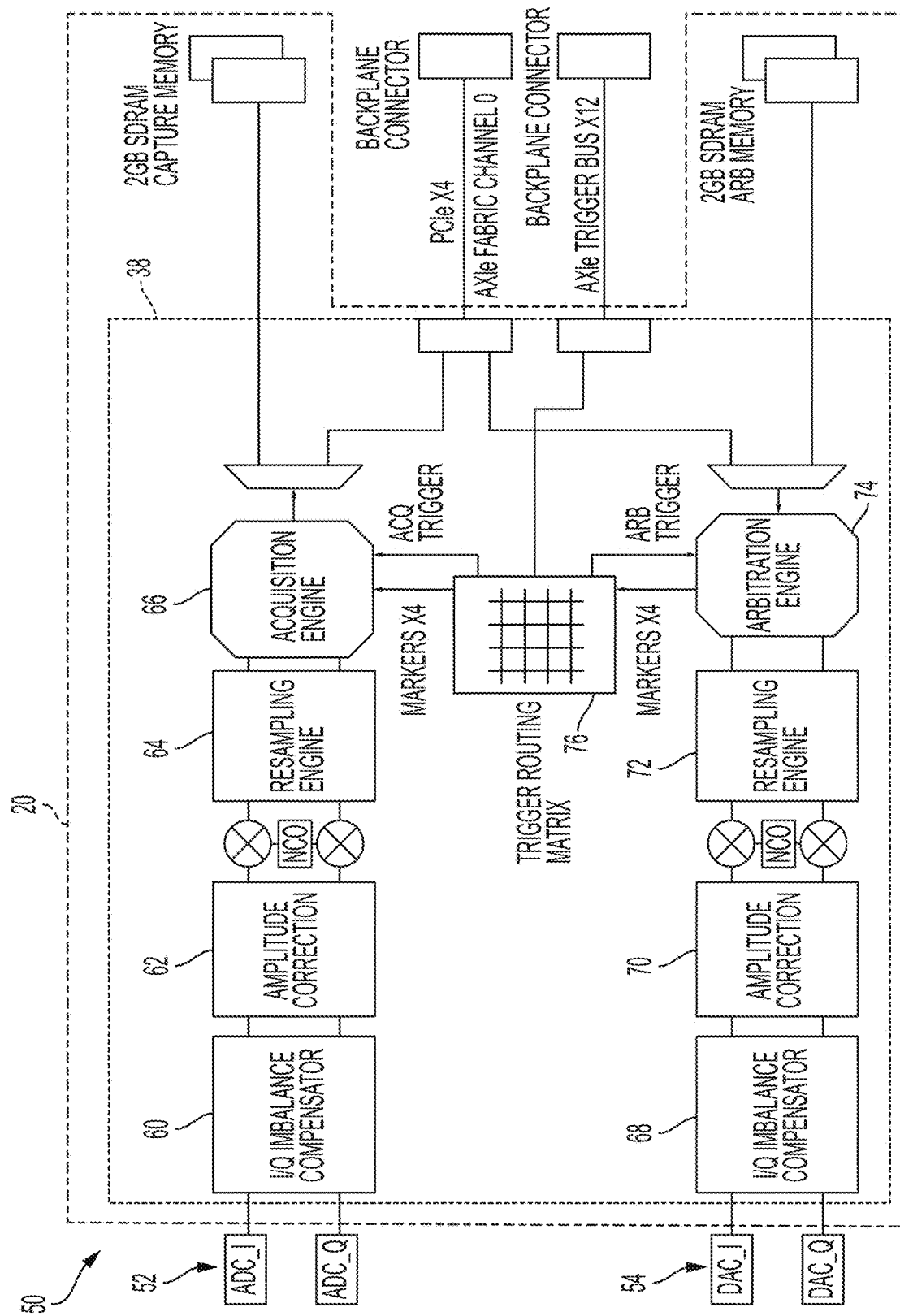
FIG. 5 is a schematic block diagram of the controller logic of the test instrument of FIG. 1.

Referring now to FIG. 5, an exemplary circuitry 50 illustrates architecture of the controller 20 having the FPGA 38, which includes a plurality of routing channels. For example, in the illustrative embodiment, the FPGA 38 includes two routing channels 52 (i.e., ADC channels) that are communicatively coupled to the receiver 16 and two routing channels 54 (i.e., DAC channels) that are communicatively coupled to the transmitter 14. The incoming ADC channels 52 are connected to an IQ imbalance compensator 60, an amplitude correction 62, a resampling engine 64, and an acquisition (ACQ) engine 66. Similarly, the outgoing DAC channels 54 are connected to an IQ imbalance compensator 68, an amplitude correction 70, a resampling engine 72, and an arbitration (ARB) engine 74. The ACQ engine 66 and the ARB engine 74 are configured to communicate with a trigger routing matrix 76. It should be appreciated that, in some embodiments, each of IQ imbalance compensators 60, 68 may be embodied as part of the transmitter 14 and the receiver 16.

A. IQ Estimation and Compensation

As described above, IQ imbalance is mainly introduced by mixer imperfections and frequency differences between in-phase (I) and quadrature (Q) channels. This impairment produces degradation in the performance of both communication systems and test equipment. The main steps of a method of estimating the complex filters for the transmitter (TX) 14 and the receiver (RX) 16 are summarized below. The following definitions are useful to describe the method:

$O_1$ is the observation at frequency f when the complex sine at frequency f is transmitted.

$O_2$ is the observation at frequency −f when the complex sine at frequency f is transmitted.

$O_3$ is the observation at frequency −f when the complex sine at frequency −f is transmitted.

$O_4$ is the observation at frequency f when the complex sine at frequency −f is transmitted.

$O_{n,\Delta}$ is the $O_n$ observation with an inherent amplitude imbalance on the I channel of $\Delta\eta$.

1) Transmitter (TX) Imbalance Filter Compensation Estimation:

The TX imbalance may be extracted from one observation if the phase is synchronized. Since such synchronization is difficult to achieve in the hardware, a second signal with amplitude imbalance may also be transmitted. One approach for extracting the TX imbalance is described in De Witt, J. J. (2011), *Modelling, estimation and compensation of imbalances in quadrature transceivers* (dissertation). As a summary, the TX compensation filter at frequency $f_m$ is given by:

$$Q(f_m) = \frac{\eta_M(f_m)e^{j\psi}M^{(fm)} - 1}{\eta_M(f_m)e^{j\psi}M^{(fm)} + 1}, \quad (1)$$

where $$\eta_M(f_m) = \left|\frac{\sqrt{\Delta\eta xy}}{\Delta\eta y}\right|$$

and $$\psi_M(f_m) = \pm\arccos\left|\frac{(\Delta\eta - 1)(\Delta\eta + 1)(K_2 - 1)(K_1 - 1)}{2\sqrt{\Delta\eta xy}}\right|,$$

where $x = 1 + K_1 - K_2 - K_2K_1 + \Delta\eta K_1 - \Delta\eta + \Delta\eta K_2 K_1 - \Delta\eta K_2,$ $y = -\Delta\eta - \Delta\eta K_1 + \Delta\eta K_2 + \Delta\eta K_2 K_1 + 1 - K_1 + K_2 - K_2K_1,$ $$K_1 = \frac{o_4}{o_1},$$

and $$K_2 = \frac{o_{4,\Delta}}{o_{1,\Delta}}.$$

It should be noted in Equation (1) that the sign of angle $\psi_m$ cannot be resolved. In consequence, it may be necessary to test the two possibilities and choose the value that produces the best, e.g., highest, IQ imbalance image rejection.

2) Receiver (RX) Imbalance Filter Compensation Estimation:

One approach for computing the RX imbalance filter compensation is described in De Witt (2011). The IQ imbalance filter compensation for the receiver (RX) imbalance can be computed as:

$$P(-f_r) = \frac{O_{i,fr}}{O^*_{d,fr}}, \quad (2)$$

where $O_{i,fr}$ is the observation $O_i$ at frequency $f_r$.

B. Fitting a Surface-Method of Least Squares

As described in greater detail below, the complex observations outlined above can be fitted to a polynomial function using a least or minimum squares approach.

1) Problem Formulation:

Given N×M many points at positions $(x_i, y_j)$ in $\mathbb{R}^2$ where $i \in [1 \ldots A] j \in [1 \ldots M]$. To obtain the polynomial function $p(x,y)$ of degree $m_x$ in x and $m_y$ in y that approximates the given scalar values $p_{i,j}$ at points $(x_i, y_j)$ using the least squares approximation approach according to the error function $J_{LS} = \Sigma_{i,j}\|p(x_i,y_i) - p_{i,j}\|^2$, a minimization of the error may be such that:

$$\min_{p \in \mathbb{R}^2} \sum_{i,j} \|p(x_i, y_i) - p_{i,j}\|^2, \quad (3)$$

where p is a function in $\mathbb{R}^2$ with k number of coefficients and can be written as $$p(x,y) = b(x,y)^T c = b(x,y) \cdot c, \quad (4)$$

where $b(x,y)$ is the polynomial basis vector and $c = [c_1, \ldots, c_k]^T$ is the vector of unknown coefficients to be minimized using Equation (3).

At this point, note that the basis vectors in Equation (4) may become very large as $m_x$ and $m_y$ increase, which can make the system inefficient to solve later on. In order to shorten the basis vector, x and y are considered to be not correlated and, therefore, all cross-terms of p(x,y) will be zero (0). Accordingly, k=$m_x$+$m_y$+1. For convenience, the x and y terms were grouped in decreasing order with the constant term being last, such that $$b(x,y) = [x^{m_x}, \ldots, x^1, y^{m_y}, \ldots, y^1, 1]^T. \quad (5)$$

2) Solution:

A system is constructed to minimize Equation (3) by using the method of normal equations:

$$\begin{bmatrix} b^T(x_1, y_1) \\ \vdots \\ b^T(x_i, y_j) \end{bmatrix} c = \begin{bmatrix} p_{1,1} \\ \vdots \\ p_{i,j} \end{bmatrix}, \quad (6)$$

which can be readily solved as $$c = (B^T B)^{-1} B^T p. \quad (7)$$

It should be noted that the Equation (6) requires the use of an inverse function, and is, therefore, sometimes inefficient in practice. Solving the system of Equation (7) by computing a QR factorization via the Eigen library's householder method achieves acceptable performance.

Earlier in the Equation (5), all cross-terms in the system were assumed to be zero in an effort to reduce the computational complexity of the system. This is useful in practice since, in some cases, $m_x$ and $m_y$ are found to be as high as 15 in order to produce a good fit—meaning that several hundred cross-terms may need to be considered in these cases. Nevertheless, the quality of the fitted surface may be improved by introducing a predefined number of the total cross-terms. Choosing to allow cross-terms of order $m_{xy}$ and fewer introduces $$k_{xy} = \frac{m_{xy}(m_{xy} - 1)}{2}$$

more terms to Equation (5), and the system can be solved in a similar fashion.

The quality of the fitted surface can also be improved by applying a center-shift transformation to the input coordinates ($x_i$, $y_i$). This is done by centering x and y around 0 and scaling them to unit standard deviation, such that $$\hat{x} = \frac{x - \bar{x}}{\sigma_x}$$

and $$\hat{y} = \frac{y - \bar{y}}{\sigma_y},$$

which is a process that improves the arithmetic properties of the system.

In order to estimate the IQ imbalance using the estimation method described above, a complex tone must be transmitted and received in the same device. In addition, to estimate both the TX and RX imbalance simultaneously, an offset between the TX and RX mixer is required. Since it is desired to estimate simultaneously several IQ imbalance errors to reduce the calibration time, several complex sines should be transmitted simultaneously. Therefore, the transmitted signal should be as follows:

$$s[n] = \sum_{m=0}^{m=N} e^{j2\pi n f n}, $$

where N is the total number of desired observations on the positive frequencies (for the negative frequencies, should be transmitted). However, if too many sine waves are transmitted, a high peak to average ratio can be obtained. Since the signal is digitized to estimate the IQ imbalance, precision can be lost at the AD converter. Therefore, all the required sine waves should be split into different signals that are transmitted at different times. Additionally, a fast Fourier transform (FFT) may be used in the receiver to estimate the IQ imbalance. To ensure that an FFT is as small as possible, an offset between the receiver and the transmitter that is multiple of a bin size may be used, such that the signal and the images lie on an FFT bin.

Considering above features, the following K signals are defined:

$$s_p[n] = \sum_{m=0}^{m=[\frac{N}{K}]} e^{j2\pi f_{steps}(p+Km)n}, \quad (8)$$

where N is the total number of observations, K indicates the distance ($Kf_{step}$, Hz) between tones for the multi-sine signal, p=[0, ..., K−1] indicates the initial frequency offset ($pf_{step}$, Hz) of the complex sines to transmit, $$f_{steps} = \frac{Bw}{N},$$

and Bw is the baseband bandwidth to be compensated.

Signal $s_p(n)$ will be transmitted to estimate the IQ imbalance of positive frequencies and $s_p^*(n)$ to estimate the IQ imbalance of negative frequencies signals. It should be noted that these signals meet the requirements that several complex sines are transmitted and that the offset p is a multiple of the bin size. Furthermore, the frequencies of the signal are separated by a bin distance. Therefore, all of them will lie on the bins of the FFT because there is not extra frequency offset. It is important to note that, since the transmitter and receiver are connected to the same clock, they will perfectly synchronize and the transmitted complex sine waves and its IQ imbalance images lie exactly on the FFT bin.

A second amplitude imbalanced signal is required to estimate the transmitter imbalance compensation if phase synchronization is not guaranteed. Therefore, the following amplitude imbalanced signal is transmitted:

$$S_{p,\Delta}[n] = \sum_{m=0}^{m=[\frac{N}{K}]} \Delta\eta\cos(2\pi f(p + Km)n) + j\sin(2\pi f(p + Km)n). \quad (9)$$

It is possible to find the frequency response of the compensation filter for the receiver, $\tilde{H}_{rx}$, and transmitter, $\tilde{H}_{tx}$, by using the $s_p[n]$ and $s_{p,\Delta}[n]$ signals and the algorithm summarized in above.

The direct current (DC) offset introduced by the DAC affects the observation and, thus, also affects the estimations of the compensation filters. Accordingly, two special complex tones, $$s_{tone}[n] \quad (10)$$

have to be sent at $f_{steps}$ and $-f_{steps}$. These tones are used to estimate the frequency response of the compensation filter at the baseband frequencies $f_{steps}$ and $-f_{steps}$.

Defining $s_p^f[n]$ as the signal $s_p[n]$ at the RF frequency f and $\tilde{H}_f[k]$ as the baseband frequency compensation estimated filter at the RF frequency f, it is possible to define the matrix of observations, $\tilde{H}$, as a surface, B, such that:

$$B = \begin{bmatrix} \tilde{H}_0[0], & \tilde{H}_0[1] & \ldots & \tilde{H}_0[N] \\ \tilde{H}_1[0], & \tilde{H}_1[1], & \ldots & \tilde{H}_1[N] \\ \vdots & \vdots & \vdots & \vdots \\ \tilde{H}_M[0], & \tilde{H}_M[1], & \ldots & \tilde{H}_M[N] \end{bmatrix}$$

These observations generate a surface that can be approximated to a polynomial equation.

As described above, the complex observations can be fitted using the least squares approach to a polynomial function of two variables, $p(f_{RF}, f_{BB})$, where $f_{RF}$ is the RF frequency and $f_{BB}$ is the baseband frequency. The transmitter and receiver polynomial function approximations are defined as $p_{tx}(f_{RF}, f_{BB})$ and $p_{rx}(f_{RF}, f_{BB})$, respectively.

There are two potential approaches to approximate the surface to compensate. A first approach, a polynomial function that fits the entire RF-frequency- and BB-frequency-based surface. This approach has the advantage that frequency tables for all the observations do not need to be stored. In this case, only a polynomial function equation is required. However, since a big surface is fitted, a bad fit on certain frequencies may be found. The second option is to fit the surface around the RF frequency that is going to be compensated. In this case, tables of observations must be stored but better performance is expected.

Once the polynomial function is estimated, a compensation filter at a desired frequency, $F_{RF}$, can be calculated. The baseband frequency response of the compensation filter is $p(F_{RF}, f_{BB})$. Furthermore, a vector of estimation values at some baseband frequencies, $\vec{f}_{BB}$, can be calculated: $\vec{p}(F_{RF}, \vec{f}_{BB})$. It should be noted that the RF frequency and the vector of baseband frequencies, $\vec{f}_{BB}$, can be one of those of the observation frequencies or not.

The complex filter impulse response can be estimated by finding the set of filter taps that minimize the error (in the least squares sense) between the desired and generated signals. The following equation may be used to calculate the filter taps:

$$\vec{a} = Q^{-1}\vec{b}$$

where $$Q_{n,k} = \sum_{m=0}^{M-1} w_m e^{-j2\pi f_m(n+k-2\rho)}$$

and $$b_k = \sum_{m=0}^{M-1} w_m D_m e^{-j2\pi f_m(k-\rho)}$$

and where $\vec{a}$ is indicative of computed taps, w is indicative of weights, f is the frequency at which the observations are taken, and D is the desired frequency response at the frequency (or frequencies) f.

In other embodiments, the impulse response of the filter can be estimated using the window method. In this method, the impulse response of a desired frequency response is derived by means of an inverse FFT. The length of the frequency response, $\vec{f}_{BB}$, should be the same as that of the desired filter length, L, and equally spaced on the band to compensate. The impulse response is defined as:

$$\tilde{h}_{un} = \mathcal{IFFT}\{\vec{f}_{BB}\}$$

$$\tilde{h}[n] = w[n] \cdot \tilde{h}_{un}[n], \ 0 \le n < N$$

where $\tilde{h}$ is the estimated compensation filter and w is the desired window. It should be noted that two different filters need to be estimated, one for the transmitter and another one for the receiver.

As described above, the algorithm for estimating and compensating the transmitter (TX) and receiver (RX) IQ imbalance by the testing system includes transmitting complex multi-sine signals for desired RF frequencies, estimating the frequency responses in the desired RF frequencies, determining a polynomial fit for a region around a target RF frequency to compensate based on the estimations, calculating, using the polynomial fit, a frequency response of the compensation filter, and calculating complex impulse responses for a TX pre-compensation filter and RX post-compensation filter using the window method.

Figure 7:
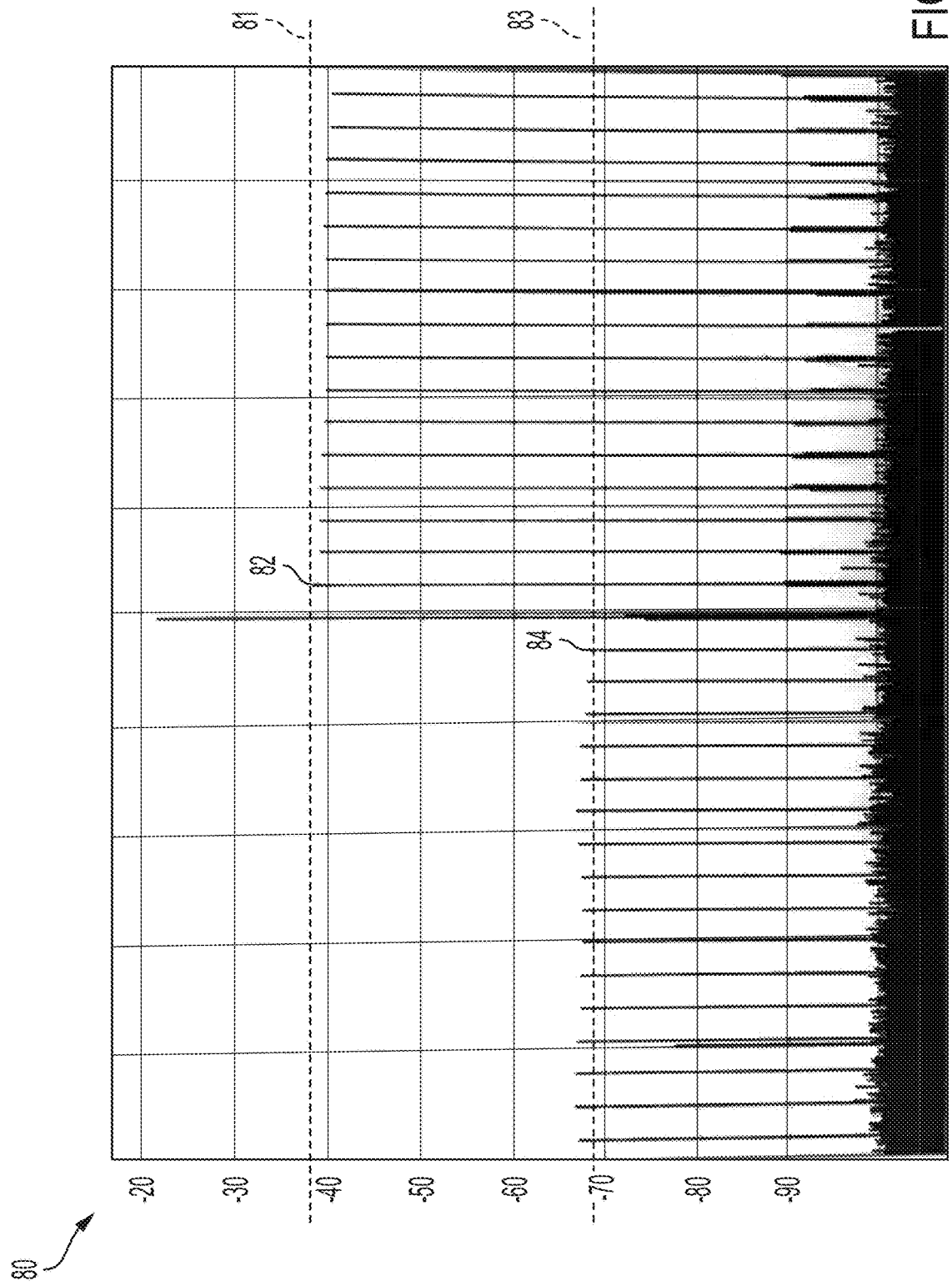
FIG. 7 is a graph illustrating a multi-sine signal transmitted at 5.125 GHz without transmitter pre-compensation received by the receiver of FIG. 1.

The test instrument 12 produces high IQ imbalance images in both the transmitter 14 and receiver 16. FIG. 7 shows an exemplary graph 80 of a complex multi-sine signal 82 transmitted at a predefined center frequency, e.g., 5.125 GHz, without TX pre-compensation. As illustrated by element 84, the TX imbalance impairments are as high as 30 decibels relative to the carrier (dBc), e.g., a difference between magnitude level 81 of the desired signal and magnitude level 83 of the imbalance impairments is as high as 30 dB.

The algorithms outlined above were used to estimate and compensate the IQ imbalance. In consequence, the signals $s_p(n)$ and $s_p^*(n)$ were transmitted and then received to generate the compensation filter surfaces for the transmitter and receiver. Data from the test instrument 12 was captured for RF frequencies between 1500 and 5600 MHz at 100-MHz steps. The baseband bandwidth for each captured RF frequency was 250 MHz. The transmitter and receiver surfaces 86, 92 are shown in FIGS. 8A and 9A, respectively. As shown in FIGS. 8A and 9A, the observations contained significant noise 87, 93. This noise is due mainly to RF spurs and the thermal noise introduced at the transmitter and receiver. Since the compensation filter has to be calculated at any RF frequency of interest, these filters are fit using the least squares approach to a multi-variable polynomial function, as described above. This polynomial function created the surfaces 88, 94 shown in FIG. 8B and FIG. 9B. It should be noted that the surfaces 88, 94 do not contain the noise 87, 93 of the observation surfaces 86, 92, respectively.

The first approach for estimating the compensation filters at a target RF frequency was by fitting all the compensation filters at the observation RF frequencies using the surface polynomial function 88 described above. FIG. 8B shows a surface fit 88 for all the compensation filters estimated based on observations captured in the transmitter surface 86 of FIG. 8A. To demonstrate that the complex compensation filters derived from the polynomial function reduce the IQ imbalance images, a pre-compensated complex multi-sine signal was transmitted at some different RF frequencies than those used during the observation process. This approach reduced significantly the IQ imbalance images since the polynomial function fit is very close to the original measurements. Pre-compensating the TX signal with the compensation filter estimated using the polynomial function suppresses the IQ images for most of the RF frequencies to values lower than 55 dBc. However, in some cases images as high as 51 dBc were measured. Since images lower than 60 dBc are desired, a polynomial function that fits only a local (i.e., limited frequency range) surface was preferred. Example graphs 90, 96 of FIGS. 8C and 9C illustrate local transmitter and receiver surfaces fit, respectively. Accordingly, storing the estimated complex filters at the observed RF frequencies is required for calibration. The parameters used to estimate and compensate the IQ imbalance for the local fit are summarized in Table 1 in FIG. 6.

A local fit of four different observed RF frequencies around the RF frequency to compensate was used to generate the response shown in FIG. 10A. Images as low as 58 dBc were measured at an external spectrum analyzer. In order to reduce further these images, observations every 50 MHz around the points to calibrate were captured. This reduced the TX IQ imbalance image magnitude to values below 60 dBc. FIG. 10A shows an exemplary graph 98 illustrating the spectrum 100 of the images of the TX imbalance at 5.125 GHz. As illustrated, for example, by element 102, the highest image is −61.7 dBc in a 200-MHz bandwidth, e.g., a difference between magnitude 116 of the desired signal and magnitude 118 of the highest imbalance image is at least 60 dB. It should be noted that spurs 104 at −80 MHz are not due to TX IQ imbalance impairments. This means an improvement of more than 30 dB for the image attenuation compared to the uncompensated TX images at the same frequency illustrated by element 84 of FIG. 7. It is important to highlight that spurs at other frequencies are below 65 dBc.

Although cross terms were used for the polynomial function fit, there was not a measurable difference when compared to polynomial functions that only use independent variables between the RF frequency axis and the baseband axis. This was expected because these parameters should be independent.

FIGS. 10B and 10C show exemplary graphs 106, 108 of the output after pre-compensation in the transmitter and post-compensation in the receiver, respectively. The images after compensation in a baseband bandwidth of 160 MHz are below 60 dBc, e.g., illustrated by a relative difference between zero (0) dB magnitude level and each of magnitude levels 110 and 112 of FIGS. 10B and 10C, respectively. The 160 MHz is introduced by the receiver. It should be noted that the spur 114 at −8.9 MHz in FIG. 10C is not due to the IQ imbalance.

As discussed above, FIGS. 7-10C illustrate IQ imbalance rejection for pre-compensated and post-compensated signals in the test instrument 12. IQ images suppression of more than 60 dBc was achieved for both transmitter 14 and receiver 16. For example, to achieve that level of suppression, the baseband bandwidths required for the transmitter 14 and the receiver 16 are 200 MHz and 160 MHz, respectively. These results show improvements compared to the 52 dBc image suppression specified by the M9381A PXIe Vector signal generator, which is available commercially from Keysight Technologies, Inc.

In one illustrative embodiment, the compensation process includes the following steps:
1) Connect the receiver 16 and the transmitter 14;
2) Compensate the baseband filters using the pseudo-noise (PN) sequence method. See, for example, Vergel, Julio and Roberts, Jean. Study of different signals suitable to obtain the frequency of an unknown stable linear time-invariant (LTI) system, for an exemplary PN sequence method;
3) Compensate for direct current (DC) offset in the transmitter and the receiver;
4) Set the transmitter RF, $f_{tx}$, frequency to the desired frequency to estimate the compensation and the receiver RF frequency to $f_{rx}=f_{tx}-2$ MHz;
5) Transmit the $s_p[n]$, $s_p*[n]$, $s_{p,\Delta}[n]$, and $s_{p,\Delta}*[n]$ signals. Save received signals;
6) Set the transmitter RF, $f_{tx}$, frequency to the desired frequency to estimate the compensation and the receiver RF frequency to $f_{rx}=f_{tx}-4$ MHz;
7) Transmit complex sine and its conjugate ($s_{tone}[n]$, $s_{tone}*[n]$);
8) Use observations to estimate transmitter and receiver compensation filters; and
9) Load filters into the FPGA and begin testing.

In some embodiments, a user may also verify that IQ imbalance images are 60 dBc or lower after the filters are loaded into the FPGA.

Finally, a calibration process was introduced based on the algorithms that estimate and compensate the IQ imbalance. To determine the final IQ image suppression value, the test instrument 12 may further be configured to measure the IQ imbalance suppression if the number of observation in baseband (N) is increased (e.g., from 125 to 250), measure the IQ imbalance suppression if the RF interval is reduced (e.g., from 50 MHz to 25 MHz), measure the IQ imbalance for the new generators, inspect variations of IQ imbalance suppression with temperature, and/or test IQ imbalance for more RF frequencies to guarantee at least 60 dB IQ image suppression.

C. Software Interfaces

Three sets of software interfaces are provided for C++ implementation of this algorithm: Complex Sine generator, TX Imbalance estimation and compensation, and RX Imbalance estimation and compensation.

1) Complex Sine Generator—AlgGenMultiSineInterface:

In the illustrative embodiment, this interface generates the multi-sine and complex tone signals to be transmitted from the transmitter as specified in at least Equations (8), (9), and (10). Using the values in Table 1 shown in FIG. 6, the steps to generate the required signals are:

1) Generate the multi-complex sine waves, e.g., as per Equation (8), at frequencies [0, 3/125, . . . , 123/125], [0, −3/125, . . . , −123/125], [1/125, 4/125, . . . , 124/125], [−1/125, −4/125, . . . , −124/125], [2/125, 5/125, . . . , 122/125], [−2/125, −5/125, . . . , −122/125] in two steps:
   a) For each set of multi-complex sine:
      i) Set the initial phase to zero for all the sine frequencies in the multi-sine signal using the SetInitialPhases method; and
      ii) Call the operator ( ) where the output is going to be generated and the normalized frequencies.
   b) For each set of multi-complex sine waves generate the imbalanced signals, e.g., as per Equation (9).
2) Generate the single tones Exemplary pseudo-code for the sine wave generator is shown in Algorithm 1.

---

Algorithm 1 Pseudo code to generate signals

```
auto gen=Ngmp::DSP::AlgGenMultiSineFast< float,
std::complex< float >>::Create( );
k=0
for (k<K)
{
    frequencySet=[k:3:125]//Create k set of frequencies;
    vectorInit=0 //Initialize phases to zero
    gen.SetInitialPhases(vectorInit);
```

-continued

Algorithm 1 Pseudo code to generate signals

```
(*gen)(outputPos,frequencySet) // Positive Multi
(*gen)(outputNeg,frequencySet) // Negative Multi
outputImbPos = real(outputPos)+2*imag(outputPos);
outputImbNeg = real(outputNeg)+2*imag(outputNeg);
}
frequencySet=[1]
(*gen)(outputTonePos,frequencySet) // Positive Tone
(*gen)(outputToneNeg,-frequencySet) // Negative Tone
//Create imbalance signals for tones
```

2) TX Imbalance Estimation Interface:

In the illustrative embodiment, the transmitter imbalance has eight main methods that can be used to estimate and compensate the TX IQ imbalance. The TX and RX interface are defined by the AlgRxImbalanceDeWittInterface and AlgTxImbalanceDeWittInterface classes, respectively. The steps include:

Set the number of complex sines that were transmitted (N). Currently, the number of observations is N=250.
Set the frequency offset between the receiver and transmitter in bins. Since the FFT size is the same as the number of observations, the offset in bins is such that $$\frac{f_{offset} f_{sampling}}{N}.$$

since the sampling frequency is 250 MHz, the offset in bins should be such that $$f_{bins} = \frac{250 f_{offset}}{N} = 1.$$

Set the imbalance for the required imbalance signal to be transmitted. Currently, the imbalance is 2.
For each RF frequency
Create a structure of RxSignal type and fill it with the received signals;
Compute the frequency response of the compensation filter for the RF frequency; and
Store the frequency response in a matrix where the rows are the RF frequencies and the columns are the frequency responses.
Calculate the surface polynomial that compensates several RF frequencies passing the matrix and the vector of RF frequencies.
Transmit the multi-tone signal using the two options for the compensation filter to determine the sign of the imaginary part of the compensation filter.

a) void SetNumberOfObservations (std::int32_t numberOfObservations): Method used to set the total number of transmitted tones at one particular RF frequency. For example, for measurements every 1 MHz in a given baseband, 250 observations are required for a 250 MHz baseband bandwidth.

b) void SetFrequencyOffsetTxRxInBins (std::int32_t frequencyOffsetMultiTxRxToSet, std::int32_t frequencyOffsetToneTxRxToSet): Indicates the distance in bins between the RX and TX mixers for the multi-sine signal and the one-tone signal. A value of one should be set for a 1 MHz offset between RX and TX frequencies and 250 observations in a 250 MHz bandwidth.

c) void SetAmplitudeImbalance (GeneralType amplitudeImbalanceToSet): The SetAmplitudeImbalance method is used to set the amplitude imbalance of the signal with IQ imbalance required by the algorithm. Currently, two is used as the value of amplitude imbalance.

d) ViaviAvCommDSP::Signal <InputType> operator( ) (const RxSignals &rxSignals): This operator calculates the frequency response of the complex filter that compensates the TX IQ imbalance for a particular RF frequency. RxSignal is a structure that includes all the signals required to estimate the TX IQ compensation complex filter.

e) ViaviAvCommDSP::Signal <InputType> operator( ) (ViaviAvCommDSP::ConstSignal <GeneralType> rfFrequencies, ViaviAvCommDSP::ConstMatrix2D <InputType> rxSignals): This operator calculates a polynomial equation surface for the observations in the matrix rxSignals at the RF frequencies rfFrequencies. The matrix and vector are related as follows:

$$\begin{bmatrix} f_{rf_0} \\ f_{rf_1} \\ \vdots \\ f_{rf_{N-1}} \end{bmatrix} \Rightarrow \begin{bmatrix} f_{B_{00}} & f_{B_{01}} & \cdots & f_{B_{0(M-1)}} \\ f_{B_{10}} & f_{B_{11}} & \cdots & f_{B_{1(M-1)}} \\ \vdots & \vdots & \vdots & \vdots \\ f_{B_{(N-1)0}} & f_{B_{(N-1)1}} & \cdots & f_{B_{(N-1)(M-1)}} \end{bmatrix}$$

For a given RF frequency, $f_{rf_i}$, the baseband compensation filter response is given by the row $[f_{B_{i0}} f_{B_{i1}} \ldots f_{B_{i(M-1)}}]$. The baseband compensation filter response, for a given RF frequency, $f_{rf_i}$, should have been estimated using the operator in section VI-B4.

f) ViaviAvCommDSP::Signal <InputType> GetCompensatorImpulseResponse (ViaviAvCommDSP::Signal <InputType> frequencyResponse, const std::uint32_t filterLength, const std::uint32_t polyOrder): Returns the impulse response for a given frequency response.

g) GetCompensatorImpulseResponse (ViaviAvCommDSP::Signal <InputType> polynomialFunction, float frequencyRF, const std::uint32_t filterLength): Interface to create an impulse response filter of filter length that compensates the IQ imbalance at RF frequency frequencyRF using the polynomial surface given by polynomialFunction.

h) ViaviAvCommDSP::ConstSignal <std::int16_t> DetermineSignImaginaryTx(const FrequencySide side, ViaviAvCommDSP::Signal <InputType> input, ViaviAvCommDSP::Signal <InputType> inputConj): Determine the sign of the imaginary part for each tone frequency. Input and InputConj should be observations at the same frequencies used to determine the IQ imbalance.

Exemplary pseudo-code to estimate the IQ imbalance compensation filter is shown in Algorithm 2.

Algorithm 2 Pseudo code to estimate TX imbalance

```
auto txImb=Ngmp::DSP::AlgTxImbalanceDeWittNoPhase
< float , std::complex< float > >::Create( )
txImb->SetFrequencyOffsetTxRxInBins( 1 , 2 ); //Set deltas
between RX & TS
txImb->SetNumberOfObservations( 250 );//Set total number
of sines
txImb->SetAmplitudeImbalance( 2 );//Set Tx imbalance
//Create signal structure with all the received tones at a given
RF frequency
typename Ngmp::DSP::AlgTxImbalanceDeWittInterface
<GeneralType,InputType>::RxSignals mySignals;
mySignals.tone[AlgDeWittIf::positive]=tonePos;
mySignals.tone[AlgDeWittIf::positiveImbalanced]=tonePosImb;
```

-continued

Algorithm 2 Pseudo code to estimate TX imbalance

```
mySignals.tone[AlgDeWittIf::negative]=toneNeg;
mySignals.tone[AlgDeWittIf::negativeImbalanced]=toneNegImb;
mySignals.multiTones[0][positive]=inputPos0;
mySignals.multiTones[0][positiveImbalanced]=inputPosImb0;
mySignals.multiTones[0][negative]=inputNeg0;
mySignals.multiTones[0][negativeImbalanced]=inputNegImb0;
mySignals.multiTones[1][positive]=inputPos1;
mySignals.multiTones[1][positiveImbalanced]=inputPosImb1;
mySignals.multiTones[1][negative]=inputNeg1;
mySignals.multiTones[1][negativeImbalanced]=inputNegImb1;
mySignals.multiTones[2][positive]=inputPos2;
mySignals.multiTones[2][positiveImbalanced]=inputPosImb2;
mySignals.multiTones[2][negative]=inputNeg2;
mySignals.multiTones[2][negativeImbalanced]=inputNegImb2;
freqTx = (*objectToTest)( mySignals ); //EstimateFrequency
response of compensator
//Get filter response but fitting first to a polynomial function.
const std::uint32_t polyOrder = 8; // Set order
const std::uint32_t desiredFilterLength = 31;
auto freqTxImpulse=txImb->GetCompensatorImpulseResponse(
  freqTx , desiredFilterLength , polyOrder );
```

3) RX Imbalance Estimation Interface:

In the illustrative embodiment, the receiver (RX) interface has six methods to estimate and compensate the RX imbalance.

a) void SetNumberOfObservations(const std::int32_t numberOfObservationsToSet): Method used to set the total number of transmitted tones for one particular RF frequency. For example, for measurements every 1 MHz in a given baseband, 250 observations are required for a 250 MHz baseband bandwidth.

b) void SetFrequencyOffsetTxRxInBins(std::int32_t frequencyOffsetMultiTxRxToSet, std::int32_t frequencyOffsetToneTxRxToSet): Indicates the distance in bins between the RX and TX mixers for the multi-sine signal and the one-tone signal. A value of one should be set for a 1 MHz offset between Rx and TX frequencies and 250 observations in a 250 MHz bandwidth.

c) ViaviAvCommDSP::Signal <InputType> operator( ) (const RxSignals &rxSignals): This operator calculates the frequency response of the complex filter that compensates the Rx IQ imbalance for a particular RF frequency. RxSignal is a structure that includes all the signals required to estimate the Rx IQ imbalance compensation complex filter. The output of this operator, compensation filter at a particular RF, will be used in subsequent stages.

d) ViaviAvCommDSP::Signal <InputType> operator ( ) (ViaviAvCommDSP::ConstSignal <GeneralType> rfFrequencies, ViaviAvComm DSP::ConstMatrix2D <InputType> rxSignals): This operator calculates a polynomial equation surface for the observations in the matrix rxSignals at the RF frequencies rfFrequencies. The matrix and vector are related as follows:

$$\begin{bmatrix} f_{rf_0} \\ f_{rf_1} \\ \vdots \\ f_{rf_{N-1}} \end{bmatrix} \Rightarrow \begin{bmatrix} f_{B_{00}} & f_{B_{01}} & \cdots & f_{B_{0(M-1)}} \\ f_{B_{10}} & f_{B_{11}} & \cdots & f_{B_{1(M-1)}} \\ \vdots & \vdots & \vdots & \vdots \\ f_{B_{(N-1)0}} & f_{B_{(N-1)1}} & \cdots & f_{B_{(N-1)(M-1)}} \end{bmatrix}.$$

For a given RF frequency, $f_{rf}$, the baseband compensation filter response is given by the row $[f_{BB_{i0}} f_{BB_{i1}} \ldots f_{BB_{i(M-1)}}]$. The baseband compensation filter response, for a given RF frequency, $f_{rf}$, should have been estimated using the operator in section VI-C3.

e) ViaviAvCommDSP::Signal <InputType> GetCompensatorImpulseResponse (ViaviAvCommDSP::Signal <InputType> frequencyResponse, const std::uint32_t filterLength, const std::uint32_t polyOrder): Returns the impulse response for a given frequency response.

f) GetCompensatorImpulseResponse(ViaviAvCommDSP::Signal <InputType> polynomialFunction, float frequencyRF, const std::uint32_t filterLength): Interface to create an impulse response filter of length filter length that compensates the IQ imbalance at RF frequency using the polynomial surface given by polynomialFunction.

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected.

There are a plurality of advantages of the present disclosure arising from the various features of the method, apparatus, and system described herein. It will be noted that alternative embodiments of the method, apparatus, and system of the present disclosure may not include all of the features described yet still benefit from at least some of the advantages of such features. Those of ordinary skill in the art may readily devise their own implementations of the method, apparatus, and system that incorporate one or more of the features of the present invention and fall within the spirit and scope of the present disclosure as defined by the appended claims.

The invention claimed is:

1. A test instrument comprising:
   a transmitter configured to transmit signals to a unit under test;
   a receiver configured to receive signals from the unit under test; and
   a controller configured to:
     generate a transmitter compensation filter at least by (i) transmitting, with the transmitter, complex multi-sine signals over a first plurality of observed frequencies within a predetermined baseband frequency range, (ii) estimating a first plurality of frequency responses that compensate for in-phase and quadrature (IQ) imbalance at the first plurality of observed frequencies within the predetermined baseband frequency range, and (iii) determining, using the first plurality of frequency responses, a transmitter polynomial surface, and
     compensate, using the transmitter compensation filter, at least one of the signals to be transmitted by the transmitter to reduce IQ imbalance in the transmitted signals, including using the transmitter polynomial surface to calculate a frequency response that reduces the IQ imbalance in the transmitted signals.

2. The test instrument of claim 1, wherein the controller is further configured to:
   generate a receiver compensation filter at least by (i) receiving, with the receiver, complex multi-sine signals over a second plurality of observed frequencies within the predetermined baseband frequency range, (ii) estimating a second plurality of frequency responses that compensate for IQ imbalance at the second plurality of observed frequencies within the predetermined baseband frequency range, and (iii) determining, using the second plurality of frequency responses, a receiver polynomial surface, and compensate, using the receiver compensation filter, at least one of the signals to be received by the receiver to reduce IQ imbalance in the received signals, including using the receiver polynomial surface to calculate a frequency response that reduces the IQ imbalance in the received signals.

3. The test instrument of claim 2, wherein to generate the transmitter compensation filter further comprises transmitting an amplitude imbalance signal in response to phases of the transmitter and the receiver not being synchronized.

4. The test instrument of claim 2, wherein the controller is configured to generate the transmitter compensation filter and the receiver compensation filter at the same time by offsetting respective operating frequencies of a mixer of the transmitter and a mixer of the receiver during the transmitting and receiving of the complex multi-sine signals.

5. The test instrument of claim 4, wherein the controller is configured to offset the respective operating frequencies by a multiple of a bin size of a fast Fourier transform (FFT) block, such that each of complex sines and images of the IQ imbalance lie on a bin of the FFT block.

6. The test instrument of claim 1, wherein the first plurality of observed frequencies comprises (i) a first observation at a positive predefined frequency when a complex sine signal is transmitted at one of the positive predefined frequency and a complex conjugate of the positive predefined frequency and (ii) a second observation at a negative predefined frequency when a complex sine signal is transmitted at one of the negative predefined frequency and a complex conjugate of the negative predefined frequency.

7. The test instrument of claim 1, wherein the controller is configured to transmit the complex multi-sine signals by transmitting separate complex sine signals at different times.

8. The test instrument of claim 1, wherein the transmitter polynomial surface includes at least one frequency outside the predetermined baseband frequency range.

9. The test instrument of claim 1, wherein the IQ imbalance includes IQ imbalance images, and wherein the controller is configured to reduce the IQ imbalance images to be at least 60 decibels (dB) below the signals to be transmitted by the transmitter.

10. The test instrument of claim 1, wherein the controller is configured to determine the transmitter polynomial surface by approximating a multi-variable polynomial function using a least squares approach.

11. The test instrument of claim 2, wherein the controller includes a transmitter IQ imbalance compensator, a receiver IQ imbalance compensator, a transmitter amplitude correction engine, a receiver amplitude correction engine, a transmitter resampling engine, a receiver resampling engine, an acquisition engine, an arbitration engine, and a trigger routing matrix, wherein the acquisition and arbitration engines are both in communication with the trigger routing matrix.

12. A method comprising:
generating a transmitter compensation filter, wherein generating the transmitter compensation filter comprises the steps of (i) transmitting, with a transmitter, complex multi-sine signals over a first plurality of observed frequencies within a predetermined baseband frequency range, (ii) estimating a first plurality of frequency responses that compensate for in-phase and quadrature (IQ) imbalance at the first plurality of observed frequencies within the predetermined baseband frequency range, and (iii) determining, using the first plurality of frequency responses, a transmitter polynomial surface.

13. The method of claim 12, further comprising:
compensating, using the transmitter compensation filter, a signal transmitted by the transmitter to reduce IQ imbalance in the transmitted signal, including using the transmitter polynomial surface to calculate a frequency response that reduces the IQ imbalance in the transmitted signal.

14. The method of claim 12, further comprising:
generating a receiver compensation filter, wherein generating the receiver compensation filter comprises the steps of (i) receiving, with a receiver, complex multi-sine signals over a second plurality of observed frequencies within the predetermined baseband frequency range, (ii) estimating a second plurality of frequency responses that compensate for IQ imbalance at the second plurality of observed frequencies within the predetermined baseband frequency range, and (iii) determining, using the second plurality of frequency responses, a receiver polynomial surface.

15. The method of claim 14, further comprising:
compensating, using the transmitter compensation filter, a signal transmitted by the transmitter to reduce IQ imbalance in the transmitted signal, including using the transmitter polynomial surface to calculate a frequency response that reduces the IQ imbalance in the transmitted signal; and
compensating, using the receiver compensation filter, a signal received by the receiver to reduce IQ imbalance in the received signal, including using the receiver polynomial surface to calculate a frequency response that reduces the IQ imbalance in the received signal.

16. The method of claim 14, wherein the transmitter compensation filter and the receiver compensation filter are generated at the same time by offsetting respective operating frequencies of a mixer of the transmitter and a mixer of the receiver during the transmitting and receiving of the complex multi-sine signals.

17. The method of claim 12, wherein the first plurality of observed frequencies comprises (i) a first observation at a positive predefined frequency when a complex sine signal is transmitted at one of the positive predefined frequency and a complex conjugate of the positive predefined frequency and (ii) a second observation at a negative predefined frequency when a complex sine signal is transmitted at one of the negative predefined frequency and a complex conjugate of the negative predefined frequency.

18. A test instrument comprising:
a transmitter configured to transmit signals to a unit under test;
a receiver configured to receive signals from the unit under test; and
a controller configured to reduce in-phase and quadrature (IQ) imbalance of the signals to be transmitted and received, at least by:
transmitting complex multi-sine signals over a first plurality of observed frequencies within a predetermined baseband frequency range,
receiving the transmitted multi-sine signals over a second plurality of observed frequencies within the predetermined baseband frequency range, the second plurality of observed frequencies being offset from the first plurality of observed frequencies,
estimating corresponding sets of frequency responses for the transmitted and received signals that compensate for IQ imbalance at the first and second pluralities of observed frequencies within the predetermined baseband frequency range, determining, using the sets of frequency responses, polynomial surfaces, approximating each of the polynomial surfaces with a corresponding one of transmitter and receiver multi-variable polynomials, and reducing the IQ imbalance of the signals to be transmitted and received based on frequency responses calculated using the transmitter and receiver multi-variable polynomials.

19. The test instrument of claim 18, wherein the controller is configured to reduce the IQ imbalance such that IQ imbalance images are at least 60 decibels (dB) below at least one of the transmitted and received signals.

20. The test instrument of claim 19, wherein the controller is configured to reduce the IQ imbalance for frequencies covering a 6-GHz bandwidth.

* * * * *